US008659170B2

(12) United States Patent
Kuo et al.

(10) Patent No.: US 8,659,170 B2
(45) Date of Patent: Feb. 25, 2014

(54) SEMICONDUCTOR DEVICE HAVING CONDUCTIVE PADS AND A METHOD OF MANUFACTURING THE SAME

(75) Inventors: Chen-Cheng Kuo, Chu-Pei (TW); Tzuan-Horng Liu, Longtan Township (TW); Chen-Shien Chen, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 83 days.

(21) Appl. No.: 12/905,276

(22) Filed: Oct. 15, 2010

(65) Prior Publication Data

US 2011/0175220 A1     Jul. 21, 2011

Related U.S. Application Data

(60) Provisional application No. 61/296,884, filed on Jan. 20, 2010.

(51) Int. Cl.
*H01L 23/48* (2006.01)
*H01L 23/52* (2006.01)
*H01L 29/40* (2006.01)
*H01L 21/44* (2006.01)

(52) U.S. Cl.
USPC ........... 257/778; 257/777; 257/737; 257/738; 438/613; 438/687

(58) Field of Classification Search
USPC .............................. 257/734–786; 438/597–688
See application file for complete search history.

(56) References Cited

U.S. PATENT DOCUMENTS

| 5,470,787 | A |   | 11/1995 | Greer |   |
|---|---|---|---|---|---|
| 5,739,587 | A | * | 4/1998 | Sato | 257/758 |
| 6,031,257 | A | * | 2/2000 | Noto et al. | 257/202 |
| 6,297,563 | B1 | * | 10/2001 | Yamaha | 257/781 |
| 7,468,545 | B2 | * | 12/2008 | Lin et al. | 257/622 |
| 7,977,783 | B1 | * | 7/2011 | Park et al. | 257/692 |
| 2003/0134496 | A1 | * | 7/2003 | Lee et al. | 438/612 |
| 2003/0155642 | A1 |   | 8/2003 | Davis et al. |   |
| 2005/0017361 | A1 | * | 1/2005 | Lin et al. | 257/756 |
| 2005/0020050 | A1 | * | 1/2005 | Huang | 438/613 |
| 2005/0029677 | A1 | * | 2/2005 | Huang | 257/780 |
| 2005/0056945 | A1 | * | 3/2005 | Lunde et al. | 257/782 |
| 2006/0267222 | A1 | * | 11/2006 | Saito | 257/786 |
| 2007/0023925 | A1 | * | 2/2007 | Ke et al. | 257/779 |

(Continued)

FOREIGN PATENT DOCUMENTS

| CN | 1204153 | 1/1999 |
|---|---|---|
| CN | 1437256 | 8/2003 |
| CN | 101281893 | 10/2008 |
| TW | 200512857 | 4/2005 |

OTHER PUBLICATIONS

Office Action dated Dec. 20, 2013 from corresponding application No. TW 100102072.

*Primary Examiner* — Fernando L Toledo
*Assistant Examiner* — Karen Kusumakar
(74) *Attorney, Agent, or Firm* — Lowe Hauptman & Ham, LLP

(57) ABSTRACT

A semiconductor device includes at least two conductive pads, one of the conductive pads being formed above another of the at least two conductive pads, and a redistribution layer extending from at least one of the conductive pads. The semiconductor device also includes a bump structure formed over the conductive pads and electrically coupled to the conductive pads.

21 Claims, 18 Drawing Sheets

(56) References Cited

U.S. PATENT DOCUMENTS

| | | |
|---|---|---|
| 2007/0069346 A1 | 3/2007 | Lin et al. |
| 2008/0012132 A1* | 1/2008 | Lin ............................... 257/738 |
| 2008/0023836 A1* | 1/2008 | Watanabe .................... 257/758 |
| 2008/0265413 A1* | 10/2008 | Chou et al. .................... 257/737 |
| 2009/0057895 A1* | 3/2009 | Lin et al. ....................... 257/737 |
| 2009/0072397 A1* | 3/2009 | Loo ................................ 257/738 |
| 2010/0155960 A1* | 6/2010 | Kanzaki et al. ............... 257/773 |
| 2010/0164096 A1* | 7/2010 | Daubenspeck et al. ....... 257/737 |

* cited by examiner

SEMICONDUCTOR DEVICE HAVING CONDUCTIVE PADS AND A METHOD OF MANUFACTURING THE SAME

CROSS-REFERENCE TO RELATED APPLICATIONS

The present application claims priority of U.S. Provisional Patent Application Ser. No. 61/296,884, filed on Jan. 20, 2010, which is incorporated herein by reference in its entirety for all purposes.

BACKGROUND

One or more embodiments relate generally to semiconductor packaging, and more particularly to a semiconductor device having two conductive pads and a method of manufacturing the same.

When packaging a semiconductor chip after circuitry has been formed thereon, interconnections between the circuitry on the chip and the input/output connecting pins on a package substrate may be implemented by Flip-Chip packaging technology. A Flip-Chip assembly includes a direct electric connection of a face down (that is, "flipped") semiconductor chip onto a package substrate, such as a ceramic substrate, a circuit board, or a carrier using conductive bumps disposed on the semiconductor chip. Flip-Chip technology is quickly replacing older wire bonding technology that uses face up semiconductor chips with the wire connected to each pad on the semiconductor chips.

To package a semiconductor chip using Flip-Chip packaging technology, the semiconductor chip is flipped and positioned on a package substrate. Conductive bumps are reflowed to form electric connections between the semiconductor chip and package substrate and provide limited mechanical mounting for the semiconductor chip and the package substrate. During the reflow process, flux is used to facilitate the joining of the conductive bumps, bond pads on the semiconductor chip, and pads on the packaging substrate. Then, excessive flux residues are removed, and an underfill adhesive, such as epoxy, is used to fill spaces between the semiconductor chip and the package substrate in order to provide even better mechanical interconnection between the semiconductor chip and the package substrate. This increases the reliability and fatigue resistance of the package interconnections and minimizes uneven stress distribution caused by thermally induced strains due to the differences in coefficients of thermal expansion (CTE) between the semiconductor chip and package substrate.

As mentioned, the Flip-Chip packaging technology involves flipping a semiconductor chip onto a package substrate and heating the flipped semiconductor chip. These operations impose a great amount of stress and strain to the semiconductor chip. With increasing utilization of mechanically weaker materials, such as low dielectric constant (low-k) materials, semiconductor chips are more vulnerable to stress and strain than those where non-low-k materials are used instead. Further, as sizes of semiconductor chips increase, the stress and strain associated with the packaging process also increases.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

The making and using of illustrative embodiments are discussed in detail below. It should be appreciated, however, that the present disclosure provides many applicable concepts that can be embodied in a wide variety of specific contexts. The specific embodiments discussed are merely illustrative, and not restrictive. A skilled person will appreciate alternative implementations.

Figure 1:
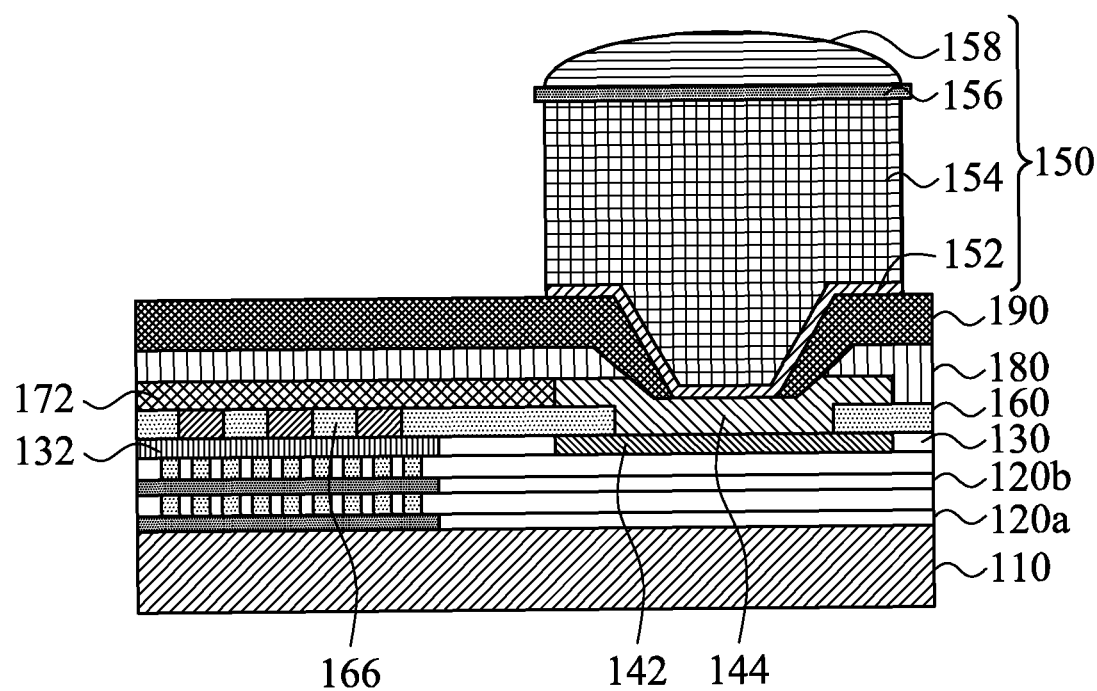
FIG. 1 is a cross-sectional view of a semiconductor device according to an embodiment.

FIG. 1 is a cross-sectional view of a semiconductor device 100 according to an embodiment. The semiconductor device 100 has a substrate 110 with circuitry, which includes various electric devices and components, formed thereon. Two metal-containing layers 120a and 120b are formed over the substrate 110, and a top metal-containing layer 130 is formed over the metal-containing layers 120a and 120b. A conductive structure 132 is formed at the top metal-containing layer 130 and electronically coupled to at least a portion of the circuitry on the substrate 110 through the metal-containing layers 120a and 120b. Two conductive pads 142 and 144 are formed over the metal-containing layers 120a and 120b and the semiconductor substrate 110, and electrically coupled to the conductive structure 132. A bump structure 150 is formed over the conductive pads 142 and 144 and electrically coupled to the conductive pads 142 and 144.

In some embodiments, the bump structure 150 includes an under bump metallurgy 152 formed over the conductive pads 142 and 144, a metal post 154 formed over the under bump metallurgy 152, a metal film 156 formed over the metal post 154, and a cap 158 formed over the metal post 154. In an embodiment, the metal post 154 is made of copper or copper alloy, the metal film 156 is made of Ni, Au or Ni-containing materials, and the cap 158 is made of metal, solder or a lead-free solder material.

Further, a passivation layer 160 is formed over the top metal-containing layer 130 and the conductive structure 132. An opening 162 (FIG. 2B) and a set of redistribution via holes 164 (FIG. 2B, three exemplary redistribution via holes are shown) are formed through the passivation layer 160. The conductive pad 142 and the conductive pad 144 are connected through the opening 162. In one embodiment, the conductive pad 142 and the conductive structure 132 are formed at the top metal-containing layer 130. The set of redistribution via holes are filled with a conductive material to form a set of redistribution via plugs 166. A conductive redistribution structure 172 is formed over the passivation layer 160, connected to the conductive pad 144, and connected to the conductive structure 132 through the set of redistribution via plugs 166. Another passivation layer 180 is formed over the passivation layer 160, the conductive redistribution structure 172, and the conductive pad 144. Finally, a protection layer 190, such as a polyimide layer, is formed over the passivation layer 180.

In some embodiments, the conductive redistribution structure 172 is also known as a redistribution layer (RDL), which is an extended portion of the conductive pad 144. The conductive redistribution structure 172 and the conductive pad 144 may be made of the same materials by the same process. In an embodiment, the conductive structure 132 and the conductive redistribution structure 172 are made of metal, such as copper or alloy including copper; the conductive material used to fill the redistribution via plugs 166 is the same as the conductive material used to form the conductive redistribution structure 172; and the conductive pad 142 is made of the conductive material used to form the conductive structure 132. In some embodiments, the conductive pad 144 is formed by first filling the opening formed through the passivation layer 160 to establish electric contact with the conductive pad 142, and then the conductive pad 144 is formed to allow the passivation layer 160 to extend into a gap between the conductive pad 142 and the conductive pad 144. In an embodiment, the conductive pad 142 is made of copper, and the conductive pad 144 is made of aluminum-copper alloy. For example, the conductive pad 144 is made of an aluminum-copper alloy with 0.5% copper. In other embodiments, the conductive pad 142 and the conductive pad 144 can be made of the same or different conductive materials. In addition, the conductive pad 142 and the conductive pad 144 have sizes and shapes to mechanically support the under bump assembly 150. For example, in some embodiments, the conductive pads 142 and 144 are octagonal with widths at 80-85 82 m.

The conductive structure 132, the conductive redistribution structure 172, the metal-containing layers 120a and 120b, and the conductive pads 142 and 144 are formed to electrically couple a portion of the circuitry on the substrate 110 with the bump structure 150. Although only two metal-containing layers 120a and 120b and one top metal-containing layer 130 are shown in FIG. 1, however, some embodiments includes more or less than two metal-containing layers and one top metal-containing layer. For example, specific embodiments include eight metal containing layers and one top metal-containing layer; other embodiments include six metal-containing layers and two top metal-containing layers. In some embodiments, the passivation layers 160 and 180 include silicon nitride and may also include small amounts of oxide and/or carbide. Further, in other embodiments, the passivation layers 160 and 180 can be made of the same or different dielectric materials.

Figure 2A:
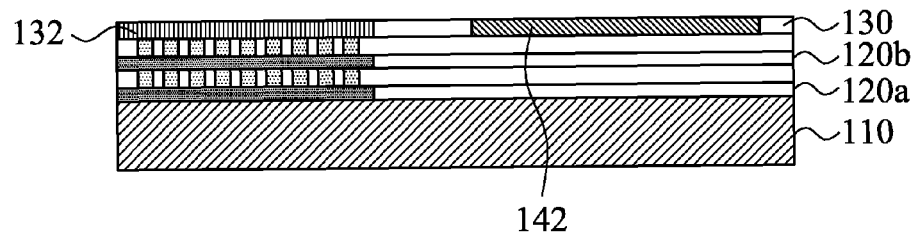
FIGS. 2A-2F are cross-sectional views showing a method of manufacturing the semiconductor device depicted in FIG. 1.
Figure 2B:
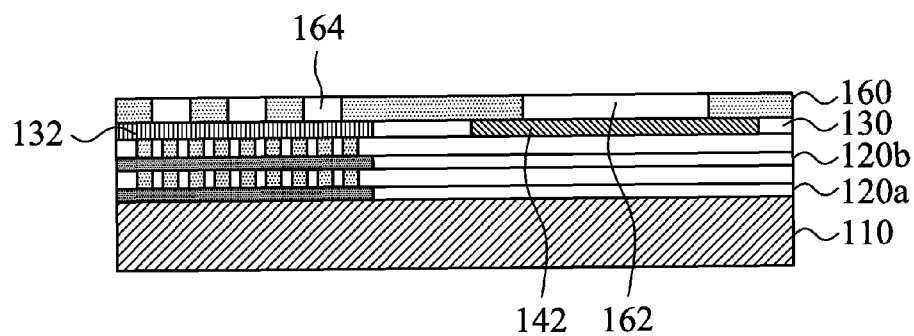

FIGS. 2A-2F are cross-sectional views showing a method of manufacturing the semiconductor device 100 depicted in FIG. 1. In FIG. 2A, a conductive pad 142 and a conductive structure 132 extending from the conductive pad 142 are formed at a top metal-containing layer 130 over a substrate 110 and two metal-containing layers 120a and 120b. The substrate 110 has circuitry formed thereon. Referring to FIG. 2B, a dielectric layer 160 is formed on the top metal-containing layer 130 and over the conductive pad 142 and the conductive structure 132. The dielectric layer 160 is used as a passivation layer for protecting the structures under the dielectric layer. A portion of the dielectric layer 160 is then removed to create an opening 162 and redistribution via holes 164 through the dielectric layer 160. For simplicity and clarity, only three redistribution via holes 164 are depicted in the Figures. In some embodiments, it is possible to have more or less than three redistribution via holes 164.

Figure 2C:
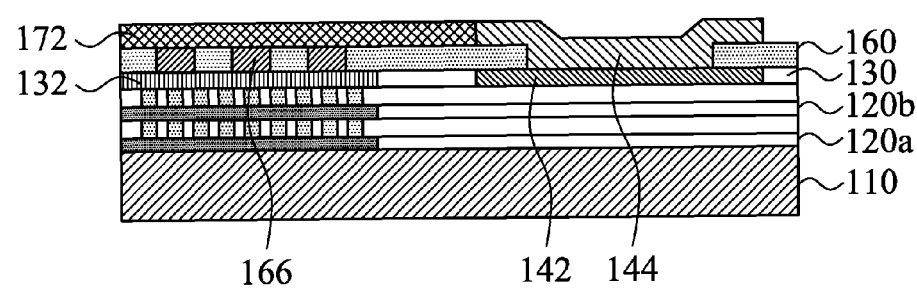
Figure 2D:
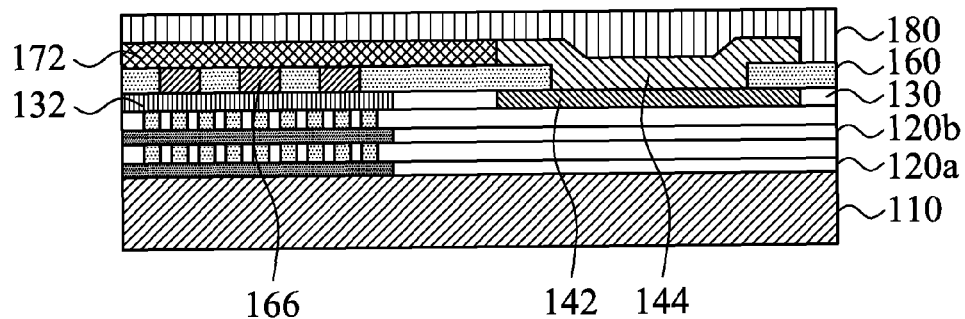
Figure 2E:
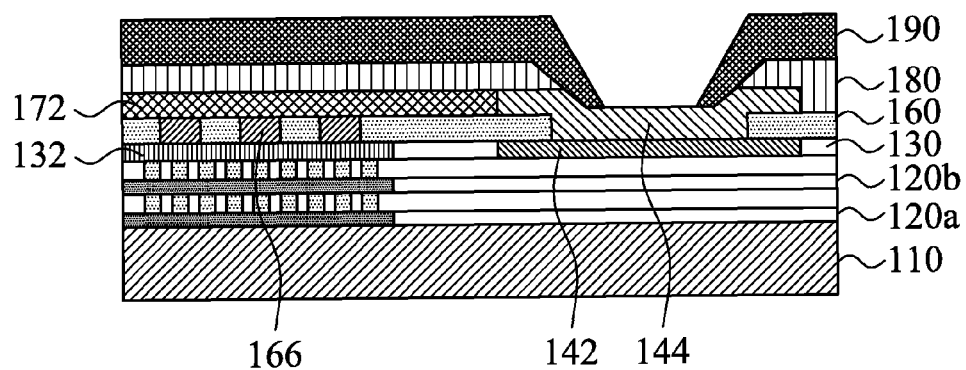
Figure 2F:
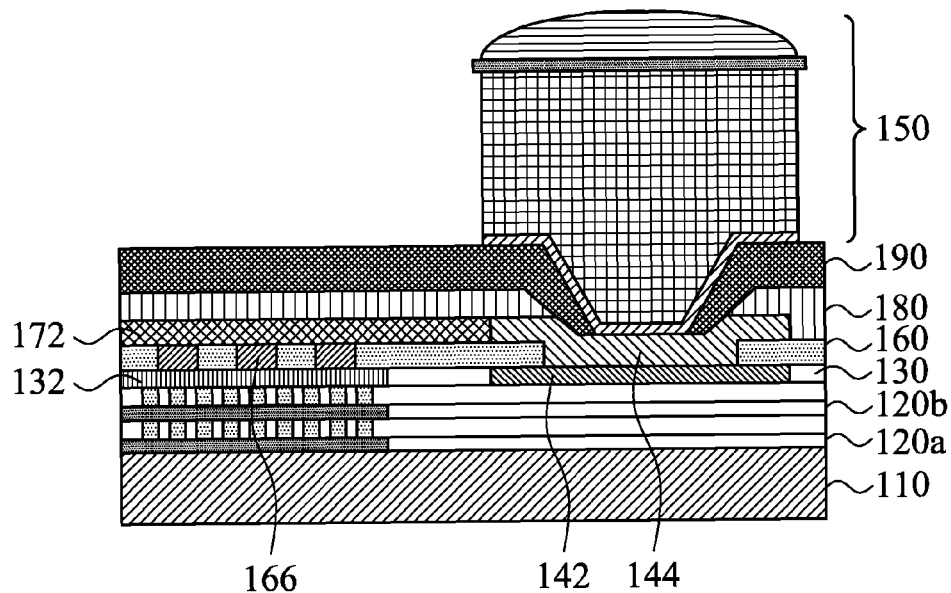

Referring to FIG. 2C, the redistribution via holes 164 are filled to form redistribution via hole plugs 166 and a conductive redistribution structure 172 is formed over the dielectric layer 160. The conductive redistribution structure 172 is connected to the conductive structure 132 through the redistribution via hole plugs 166. Also, the opening 162 is filled and a conductive pad 144 is formed over and connected to the conductive pad 142 through the opening 164. In an embodiment, the conductive redistribution structure 172 is an extended portion of the conductive pad 144. Referring to FIG. 2D, another dielectric layer 180 working as a passivation layer is formed over the dielectric layer 160, the conductive pad 144, and the conductive redistribution structure 172. In FIG. 2E, a protection layer 190 is further formed over the dielectric layer 180, and an opening is formed to expose a portion of the conductive pad 144. Finally, in FIG. 2F, an under bump assembly 150 is formed over the conductive pad 144.

Figure 3:
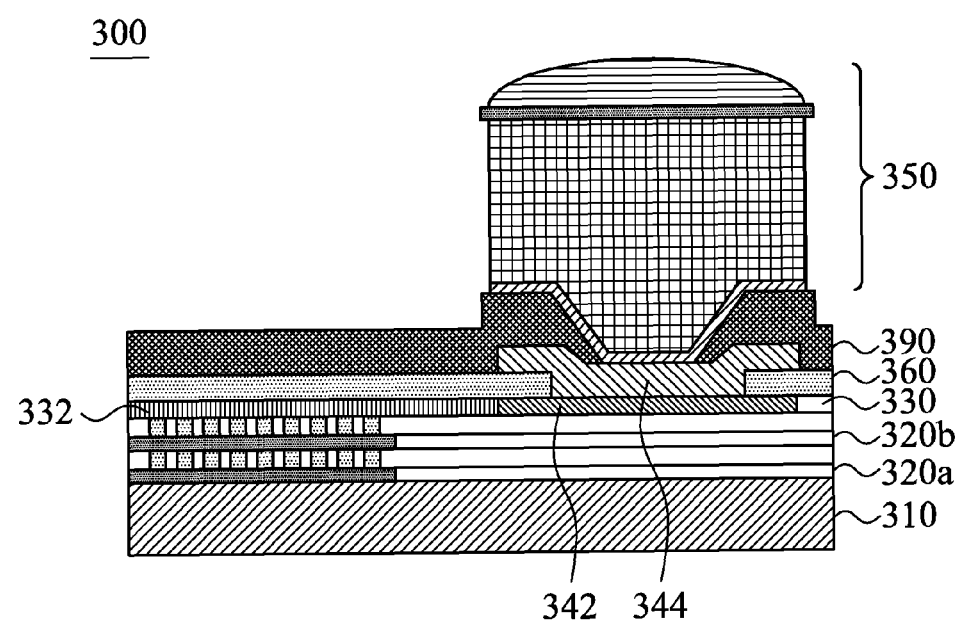
FIG. 3 is a cross-sectional view of a semiconductor device according to an embodiment.

FIG. 3 is a cross-sectional view of a semiconductor device 300 according to an embodiment. Similar to the embodiment depicted in FIG. 1, the semiconductor device 300 has a substrate 310 with circuitry formed thereon. Two metal-containing layers 320a and 320b are formed over the substrate 310, and a top metal-containing layer 330 is formed over the metal-containing layers 320a and 320b. A conductive structure 332 is formed at the top metal-containing layer 330 and electronically coupled to at least a portion of the circuitry on the substrate 310 through the metal-containing layers 320a and 320b. Two conductive pads 342 and 344 are formed over the metal-containing layers 320a and 320b and the semiconductor substrate 310, and electrically coupled to the conductive structure 332. In some embodiments, the conductive structure 332 is an extended portion of conductive pad 342 and works as a redistribution layer. A bump structure 350 is formed over the conductive pads 342 and 344 and electrically coupled to the conductive pads 342 and 344.

Further, a passivation layer 360 is formed over the top metal-containing layer 330, the conductive pad 342, and the conductive structure 332. An opening 362 (FIG. 4B) is formed through the passivation layer 360. Conductive pad 344 is formed in the opening 362 and over the passivation layer 360. The conductive pad 342 and the conductive pad 344 are connected through the opening 362 (FIG. 4C). In one embodiment, the conductive structure 332 is an extended portion of the conductive pad 342 at the top metal-containing layer 330. Finally, a protection layer 390, such as a polyimide layer, is formed over the passivation layer 360 and the conductive pad 344 (FIG. 4D).

Similar to the embodiment depicted in FIG. 1, in an embodiment, the conductive structure 332 is made of metal, such as copper or alloy including copper. In some embodiments, the conductive pad 344 is formed by first filling the opening 362 formed through the passivation layer 360 to establish electric contact with the conductive pad 342, and then the conductive pad 344 is formed to allow the passivation layer 360 to extend to a gap between the conductive pad 342 and the conductive pad 344. In an embodiment, the conductive pad 342 is made of copper, and the conductive pad 344 is made of aluminum-copper alloy with 0.5% copper. In other embodiments, the conductive pad 342 and the conductive pad 344 can be made of the same or different conductive materials. In addition, the conductive pad 342 and the conductive pad 344 have sizes and shapes to mechanically support the under bump assembly 350. For example, in some embodiments, the conductive pads 342 and 344 are octagonal with widths at 80-85 μm.

The conductive structure 332, the metal-containing layers 320a and 320b, and the conductive pads 342 and 344 are formed to electrically couple a portion of the circuitry on the substrate 310 with the bump structure 350. The metal-containing layers 320a and 320b and the top metal-containing layer 330 are only exemplary, and in some embodiments, there can be more or less than two metal-containing layers and one top metal-containing layer. Further, in some embodiments, the passivation layers 360 include silicon nitride and may also include small amounts of oxide and/or carbide.

Figure 4A:
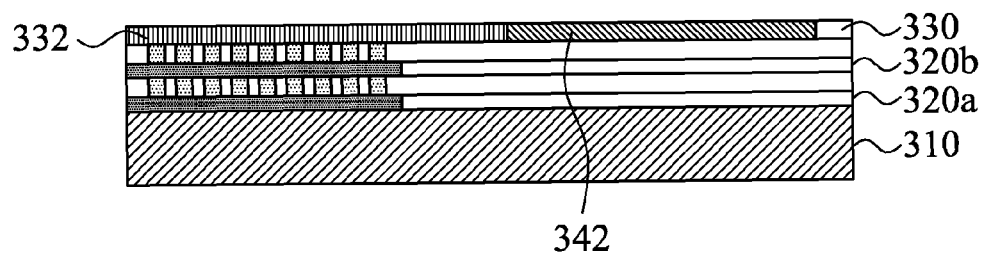
FIGS. 4A-4E are cross-sectional views showing a method of manufacturing the semiconductor device depicted in FIG. 3.
Figure 4B:
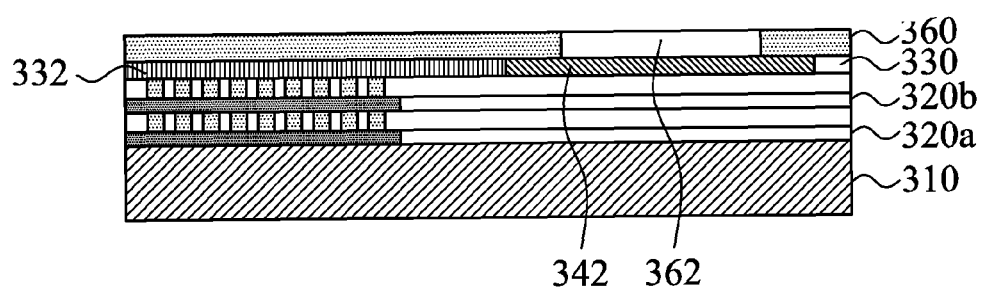
Figure 4C:
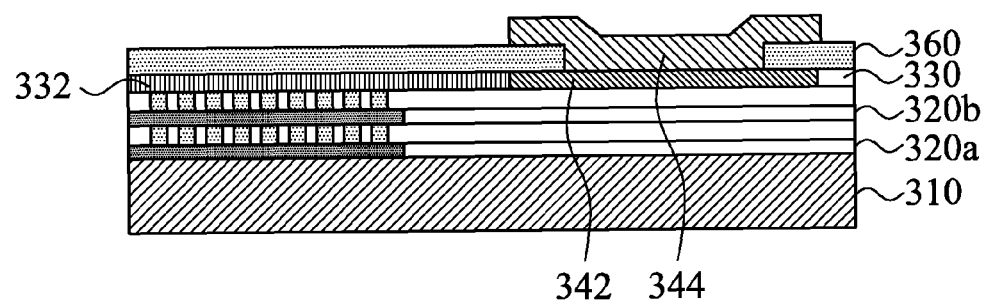
Figure 4D:
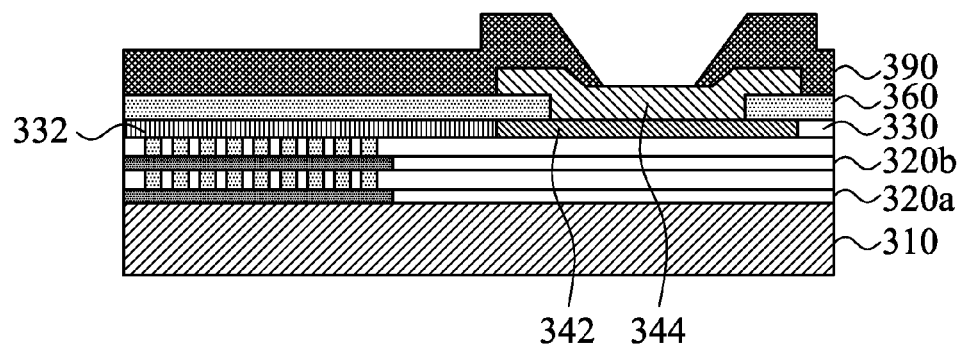
Figure 4E:
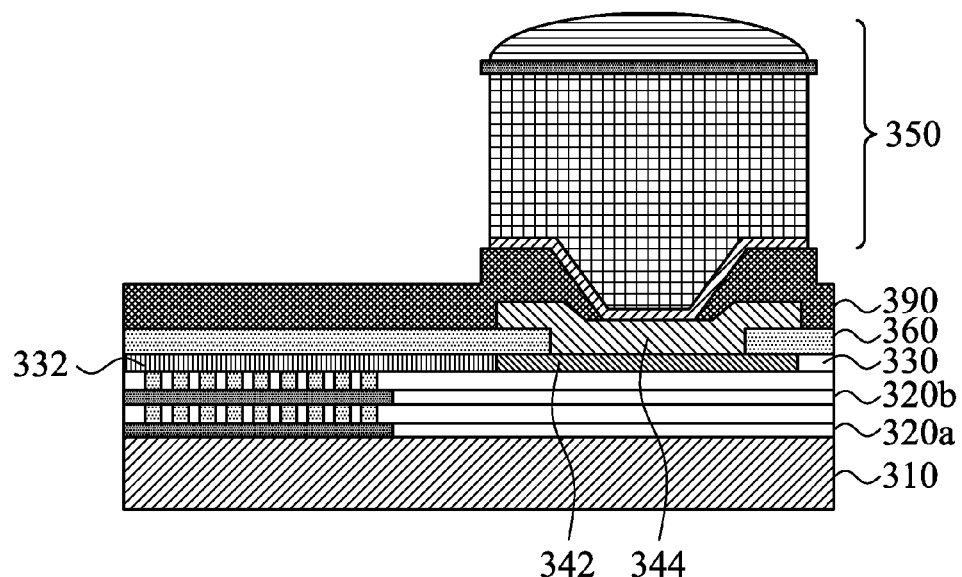

FIGS. 4A-4E are cross-sectional views showing a method of manufacturing the semiconductor device 300 depicted in FIG. 3. In FIG. 4A, a conductive pad 342 and a conductive structure 332 extending from the conductive pad 342 are formed at a top metal-containing layer 330 over a substrate 310 and two metal-containing layers 320a and 320b. The conductive pad 342 and a conductive structure 332 may be formed at the same time. The substrate 310 has circuitry formed thereon. Referring to FIG. 4B, a dielectric layer 360 is formed on the top metal-containing layer 330 and over the conductive pad 342 and the conductive structure 332. The dielectric layer 360 is a passivation layer that protects the structures underneath. A portion of the dielectric layer 360 is then removed to create an opening 362 through the dielectric layer 360.

Referring to FIG. 4C, the opening 362 is filled and a conductive pad 344 is formed over and connected to the conductive pad 342 through the opening 362. Referring to FIG. 4D, a protection layer 390 is further formed over the dielectric layer 360 and a portion of the conductive pad 344, and an opening is formed to expose a portion of the conductive pad 344. Finally, in FIG. 4E, an under bump assembly 350 is formed over the conductive pad 344.

Figure 5:
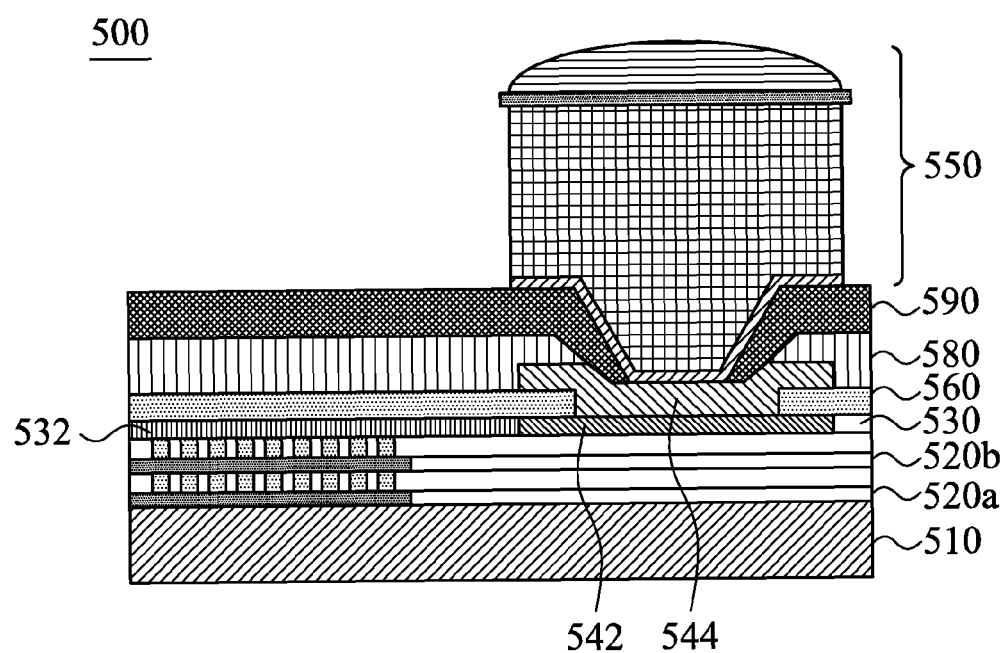
FIG. 5 is a cross-sectional view of a semiconductor device according to an embodiment.

FIG. 5 is a cross-sectional view of a semiconductor device 500 according to an embodiment. Similar to the embodiment depicted in FIG. 1, the semiconductor device 500 has a substrate 510 with circuitry formed thereon. Two exemplary metal-containing layers 520a and 520b are formed over the substrate 510, and an exemplary top metal-containing layer 530 is formed over the metal-containing layers 520a and 520b. A conductive structure 532 is formed at the top metal-containing layer 530 and electronically coupled to at least a portion of the circuitry on the substrate 510 through the metal-containing layers 520a and 520b. Two conductive pads 542 and 544 are formed over the metal-containing layers 520a and 520b and the semiconductor substrate 510, and electrically coupled to the conductive structure 532. In some embodiments, conductive structure 532 is an extended portion of conductive pad 542 and works as a redistribution layer. A bump structure 550 is formed over the conductive pads 542 and 544 and electrically coupled to the conductive pads 542 and 544.

Further, a passivation layer 560 is formed over the top metal-containing layer 530 and the conductive structure 532. An opening 562 (FIG. 6B) is formed through the passivation layer 560. The conductive pad 542 and the conductive pad 544 are connected through the opening 562. In one embodiment, the conductive structure 532 is an extended portion of the conductive pad 542 at the top metal-containing layer 530. Finally, another passivation layer 580 is formed over the passivation layer 560 and the conductive pad 544, and a protection layer 590, such as a polyimide layer, is formed over the passivation layer 580.

In an embodiment, the conductive structure 532 is made of metal, such as copper or alloy including copper; and the conductive pad 542 is made of the conductive material used to form the conductive structure 532. In some embodiments, the conductive pad 544 is formed by first filling the opening 562 formed through the passivation layer 560 to establish electric contact with the conductive pad 542, and then the conductive pad 544 is formed to allow the passivation layer 560 to extend to a gap between the conductive pad 542 and the conductive pad 544. In an embodiment, the conductive pad 542 is made of copper, and the conductive pad 544 is made of aluminum-copper alloy with 0.5% copper. In other embodiments, the conductive pad 542 and the conductive pad 544 can be made of the same or different conductive materials. In addition, the conductive pad 542 and the conductive pad 544 have sizes and shapes to mechanically support the under bump assembly 550. For example, in some embodiments, the conductive pads 542 and 544 are octagonal with widths at 80-85 μm.

The conductive structure 532, the metal-containing layers 520a and 520b, and the conductive pads 542 and 544 are formed to electrically couple a portion of the circuitry on the substrate 110 with the bump structure 550. The metal-containing layers 520a and 520b and the top metal-containing layer 530 are only exemplary, and in some embodiments, there can be more or less than two metal-containing layers and one top metal-containing layer. Further, in some embodiments, the passivation layers 560 and 580 can be made of the same or different dielectric materials. For example, the passivation layers 560 and 580 may include silicon nitride and may also include small amounts of oxide is and/or carbide.

Figure 6A:
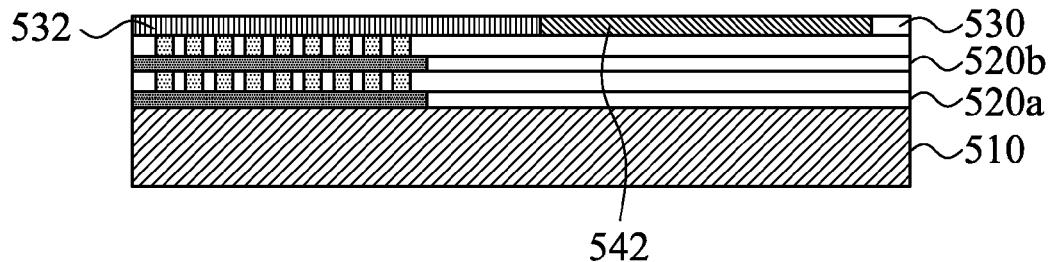
FIGS. 6A-6F are cross-sectional views showing a method of manufacturing the semiconductor device depicted in FIG. 5.
Figure 6B:
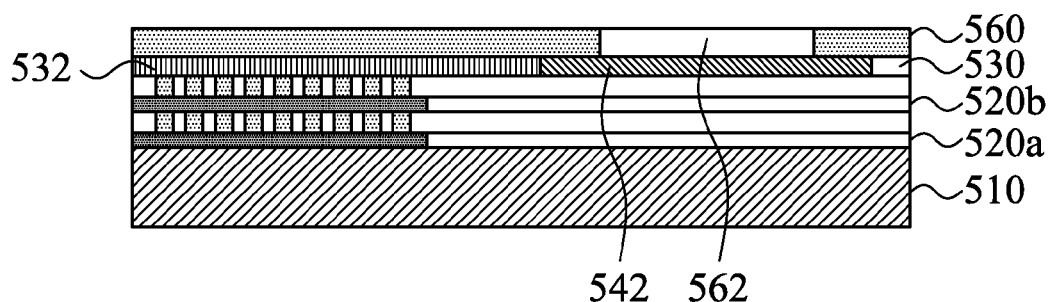

FIGS. 6A-6F are cross-sectional views showing a method of manufacturing the semiconductor device 500 depicted in FIG. 5. In FIG. 6A, a conductive pad 542 and a conductive structure 532 extending from the conductive pad 542 are formed at a top metal-containing layer 530 over a substrate 510 and two metal-containing layers 520a and 520b. The conductive pad 542 and a conductive structure 532 may be formed at the same time. The substrate 510 has circuitry formed thereon. Referring to FIG. 6B, a dielectric layer 560 is formed on the top metal-containing layer 530 and over the conductive pad 542 and the conductive structure 532. The dielectric layer 560 is used as a passivation layer for protecting the structures underneath. A portion of the dielectric layer 560 is then removed to create an opening 562 through the dielectric layer 560.

Figure 6C:
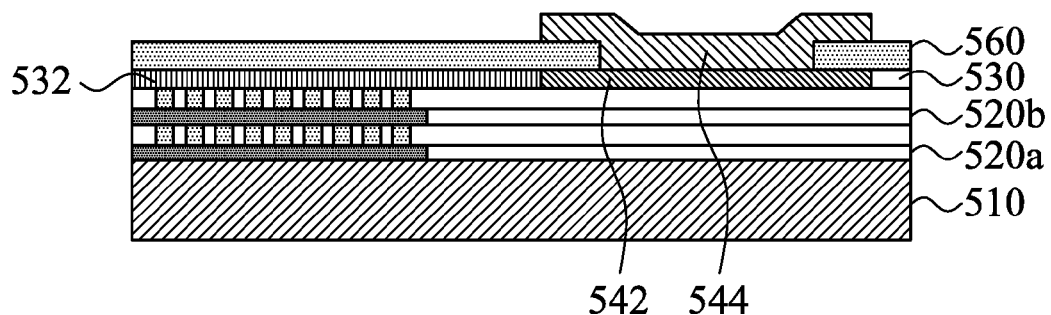
Figure 6D:
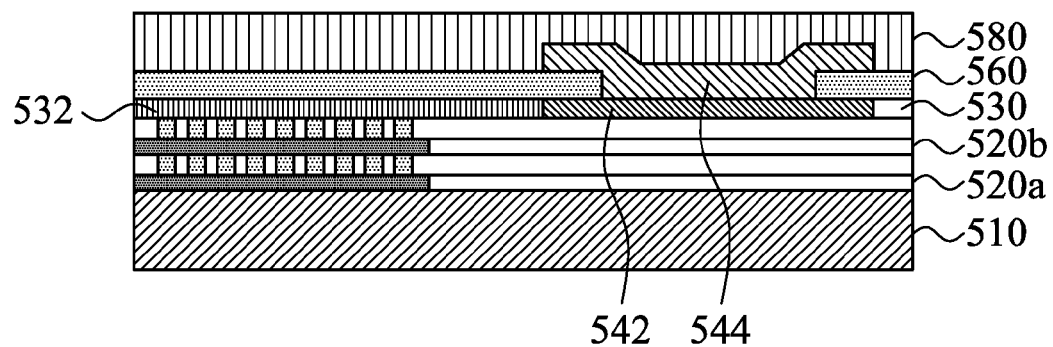
Figure 6E:
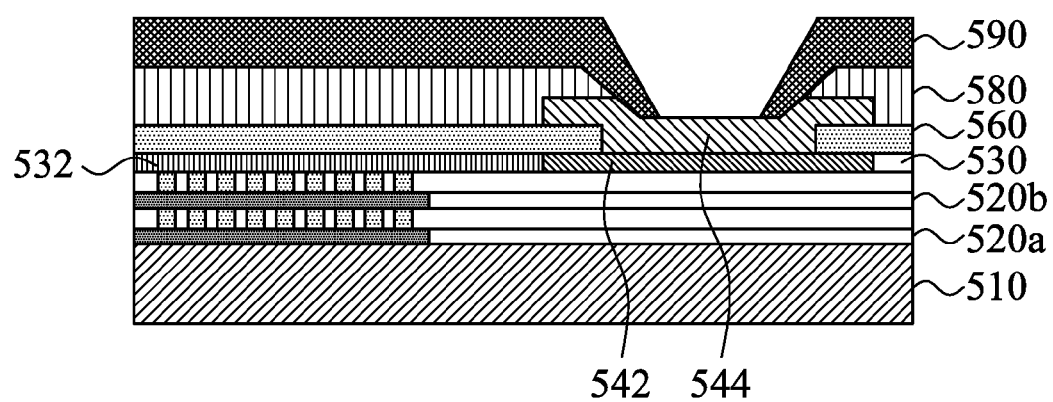
Figure 6F:
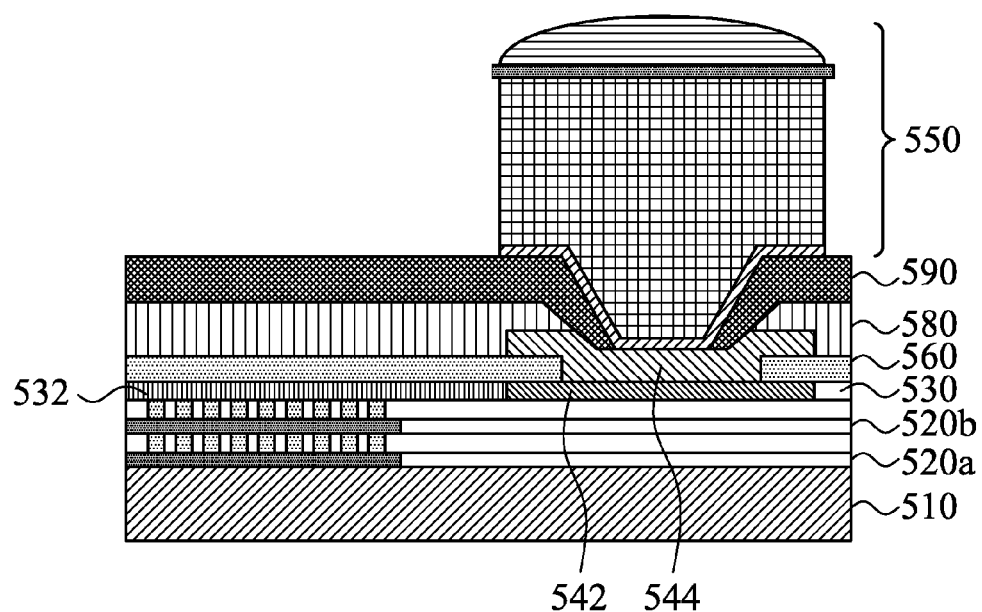

Referring to FIG. 6C, the opening 562 is filled and a conductive pad 544 is formed over and connected to the conductive pad 542 through the opening 562. Referring to FIG. 6D, another dielectric layer 580 working as a passivation layer is formed over the dielectric layer 560 and the conductive pad 544. In FIG. 6E, a portion of the dielectric layer 580 is removed and a protection layer 590 is further formed over the dielectric layer 580. Finally, in FIG. 6F, an under bump assembly 550 is formed over the conductive pad 544.

Figure 7:
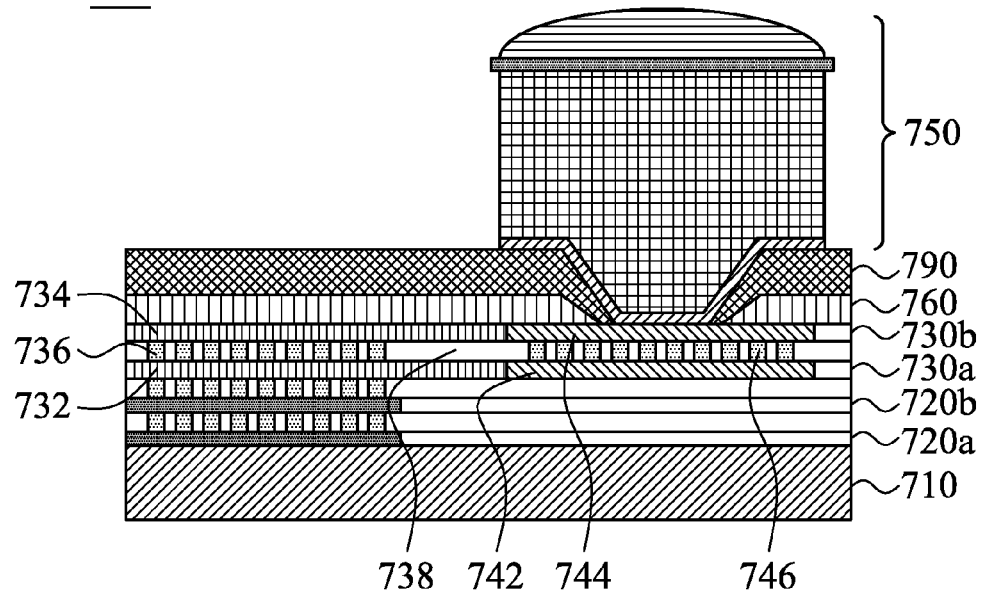
FIG. 7 is a cross-sectional view of a semiconductor device according to an embodiment.

FIG. 7 is a cross-sectional view of a semiconductor device 700 according to an embodiment. Similar to the embodiment depicted in FIG. 1, the semiconductor device 700 has a substrate 710 with circuitry formed thereon. Two metal-containing layers 720a and 720b are formed over the substrate 710, and two top metal-containing layers 730a and 730b are formed over the metal-containing layers 720a and 720b. Two conductive structures 732 and 734 are formed at the top metal-containing layer 730a and top metal-containing layer 730b, respectably. The conductive structures 732 and 734 are connected with each other by a set of top via plugs formed in a top dielectric layer 738 by filling a set of top via holes 736 with a conductive material. Two conductive pads 742 and 744 are formed over the metal-containing layers 720a and 720b and the semiconductor substrate 710, and electrically connected to at least one of the conductive structures 732 and 734. A bump structure 750 is formed over the conductive pads 742 and 744 and electrically coupled to the conductive pads 742 and 744.

Further, the top dielectric layer 738 is formed over the conductive structure 732 and the conductive pad 742, and under the conductive structure 734 and the conductive pad 744. A plurality of openings 746 formed through the top dielectric layer 738, and the conductive pad 742 and the conductive pad 744 are connected through the openings 746. In one embodiment, there is only one opening 746; in other embodiments, the openings 746 are formed as a set of via holes. The conductive structure 734 is formed over the top dielectric layer 738 and under a passivation layer 760, which is formed over the top metal-containing layers 730a and 730b and the conductive structures 743 and 734. Finally, a protection layer 790, such as a polyimide layer, is formed over the passivation layer 760 and the conductive pad 744.

The conductive structure 732 and the conductive pad 742 are formed at the top metal-containing layer 730a, and the conductive structure 734 and the conductive pad 744 are formed at the top metal-containing layer 730b. The conductive structures 732 and 734 are connected to the conductive pads 742 and 744 at the top metal-containing layers 730a and 730b, respectively. In other embodiments, only one of the conductive structures 732 and 734 is connected to the corresponding conductive pads 742 and 744. In some embodiments, at least one of the conductive structures 732 or 734 is an extended portion of a respective conductive pad 742 or 744 and works as a redistribution layer. In a particular embodiment, conductive structure 732 is an extended portion of conductive pad 742 and works as a redistribution layer, and conductive structure 734 is an extended portion of conductive pad 744 and works as another redistribution layer.

Similar to the embodiment depicted in FIG. 1, in an embodiment, the conductive structures 732 and 734 are made of metal, such as copper or alloy including copper. In some embodiments, the conductive pad 744 is formed by first filling the openings 746 formed through the top dielectric layer 738 to establish electric contact with the conductive pad 742, and then the conductive pad 744 is formed concurrently with the conductive structure 734. In an embodiment, the conductive pads 742 and 744 are made of copper. In other embodiments, the conductive pad 742 and the conductive pad 744 can be made of the same or different conductive materials. In addition, the conductive pad 742 and the conductive pad 744 have sizes and shapes to mechanically support the under bump assembly 750.

The conductive structures 732 and 734, the metal-containing layers 720a and 720b, and the conductive pads 742 and 744 are formed to electrically couple a portion of the circuitry on the substrate 710 with the bump structure 750. The metal-containing layers 720a and 720b and the top metal-containing layers 730a and 730b are only exemplary, and in some embodiments, there can be more or less than two metal-containing layers and two top metal-containing layers. Further, in some embodiments, the passivation layers 760 include silicon nitride and may also include small amounts of oxide and/or carbide.

Figure 8A:
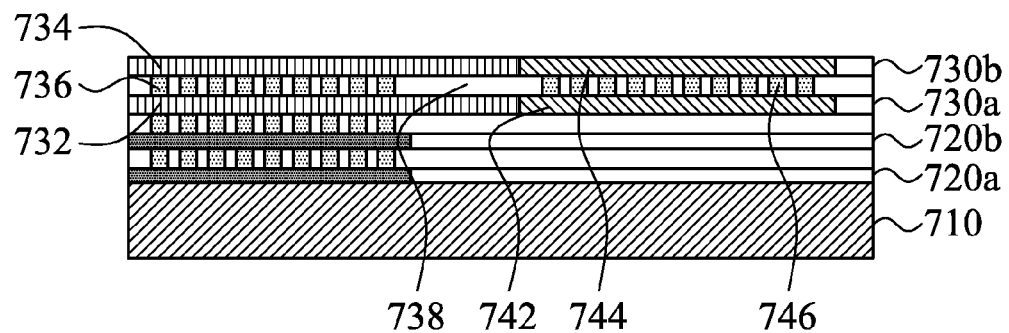
FIGS. 8A-8D are cross-sectional views showing a method of manufacturing the semiconductor device depicted in FIG. 7.

FIGS. 8A-8D are cross-sectional views showing a method of manufacturing the semiconductor device 700 depicted in FIG. 7. In FIG. 8A, a conductive pad 742 and a conductive structure 732 extending from the conductive pad 742 are formed at a top metal-containing layer 730a over a substrate 710 and two metal-containing layers 720a and 720b. The conductive pad 742 and a conductive structure 732 may be formed at the same time. The substrate 710 has circuitry formed thereon. Then a dielectric layer 738 is formed on the top metal-containing layer 730a and over the conductive pad 742 and the conductive structure 732. Here, the dielectric layer 738 is used as a top dielectric layer to separate the top metal-containing layer 730a from another top metal containing layer 730b. A portion of the dielectric layer 738 is removed to create a plurality of openings (via holes) 746 and top via holes 736 through the dielectric layer 738. The top via holes 736 are filled with a conductive material and a conductive structure 734 is formed over and connected to the conductive structure 732 through the top via holes 736, and the openings 746 are filled with a conductive material and a conductive pad 744 is formed over and connected to the conductive pad 742 through the openings 746. Further, the conductive pad 744 and the conductive structure 734 extending from the conductive pad 744 are formed at the top metal-containing layer 730b over dielectric layer 738.

Figure 8B:
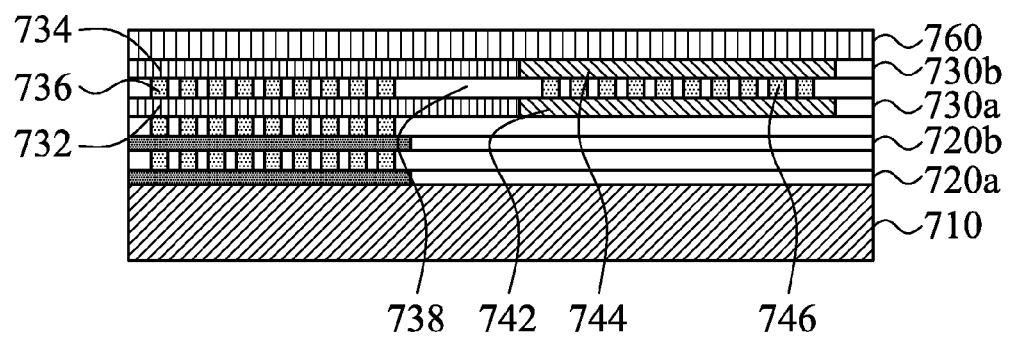
Figure 8C:
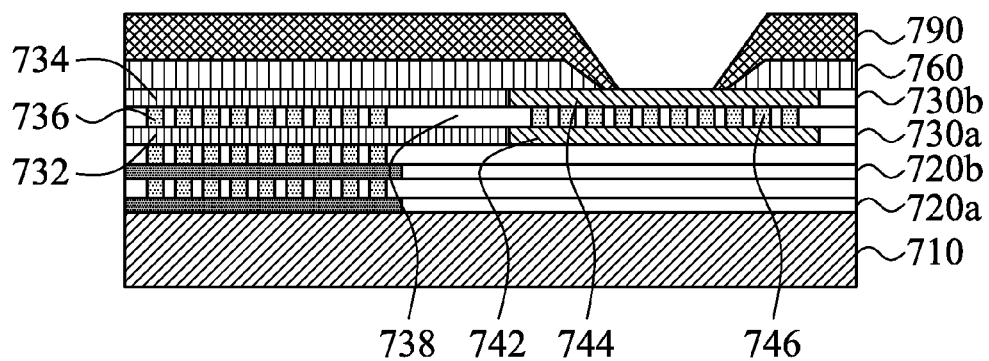
Figure 8D:
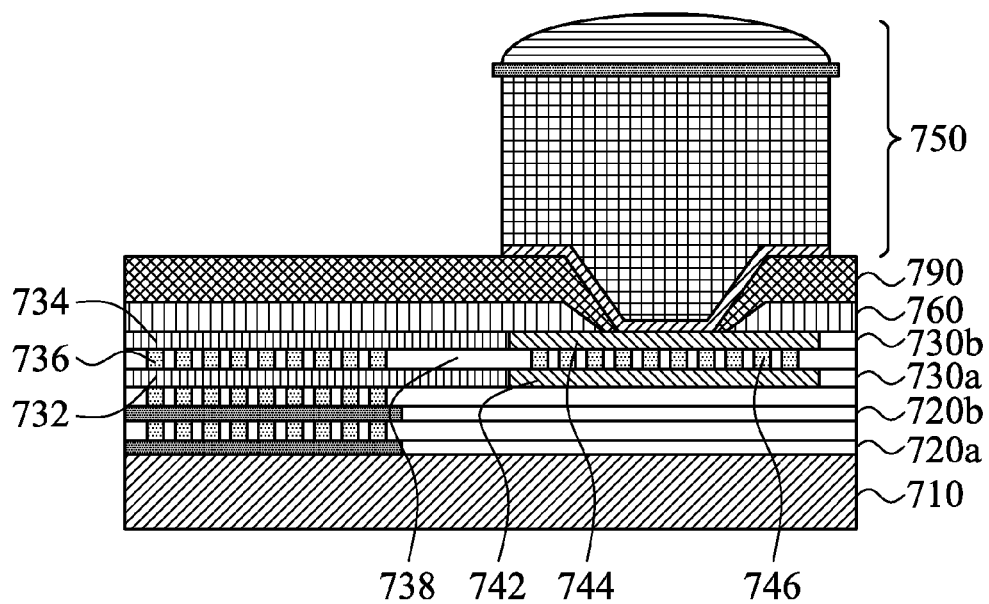

Referring to FIG. 8B, another dielectric layer 760 is formed over the conductive pad 744 and the conductive structure 734. The dielectric layer 760 is used as a passivation layer for protecting the structures underneath. Then a portion of the dielectric layer 760 is removed and a protection layer 790 is further formed over the dielectric layer 760, and an opening is formed to expose a portion of the conductive pad 744. Finally, in FIG. 8D, an under bump assembly 750 is formed over the conductive pad 744.

Figure 9:
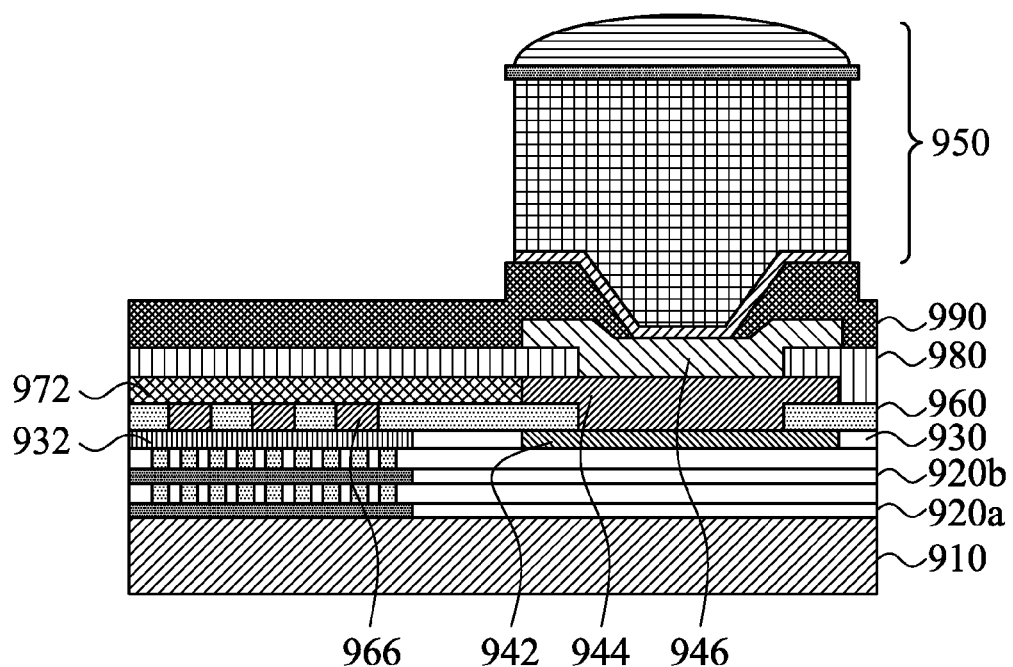
FIG. 9 is a cross-sectional view of a semiconductor device according to an embodiment.

FIG. 9 is a cross-sectional view of a semiconductor device 900 according to an embodiment. Similar to the embodiment depicted in FIG. 1, the semiconductor device 900 has a substrate 910 with circuitry formed thereon. Two metal-containing layers 920a and 920b are formed over the substrate 910, and a top metal-containing layer 930 is formed over the metal-containing layers 920a and 920b. A conductive structure 932 is formed at the top metal-containing layer 930 and electronically coupled to at least a portion of the circuitry on the substrate 910 through the metal-containing layers 920a and 920b. Three conductive pads 942, 944, and 926 are formed over the metal-containing layers 920a and 920b and the semiconductor substrate 910, and electrically coupled to the conductive structure 932. A bump structure 950 is formed over the conductive pads 942, 944, and 946 and electrically coupled to the conductive pads 942, 944, and 946.

Further, a passivation layer 960 is formed over the top metal-containing layer 930 and the conductive structure 932. An opening 962 (FIG. 10B) and a set of redistribution via holes 964 (FIG. 10B, three exemplary redistribution via holes are shown here) are formed through the passivation layer 960. The conductive pad 942 (the lower pad) and the conductive pad 944 (the middle pad) are connected through the opening 962. In one embodiment, the conductive pad 942 and the conductive structure 932 extending from the conductive pad 942 are formed at the top metal-containing layer 930. The set of redistribution via holes are filled with a conductive material to form a set of redistribution via plugs 966. A conductive redistribution structure 972 is formed over the passivation layer 960, connected to the conductive pad 944, and connected to the conductive structure 932 through the set of redistribution via plugs 966.

Further, another passivation layer 980 is formed over the passivation layer 960, the conductive redistribution structure 972, and the conductive pad 944. Another conductive pad 946 (the upper pad) is further formed under the bump structure 950 and over the conductive pad 944 and connected to the conductive pad 944 through an opening formed through the passivation layer 980. Finally, a protection layer 990, such as a polyimide layer, is formed over the passivation layer 980.

In some embodiments, the conductive redistribution structure 972 is also known as a redistribution layer (RDL), which is an extended portion of the conductive pad 944. In an embodiment, the conductive structure 932 and conductive redistribution structure 972 are made of metal, such as copper or alloy including copper; the conductive material used to fill the redistribution via plugs 966 is the same as the conductive material used to form the conductive redistribution structure 972; and the conductive pad 942 is made of the conductive material used to form the conductive structure 932. In some embodiments, the conductive pad 944 is formed by first filling the opening formed through the passivation layer 160 to establish electric contact with the conductive pad 942, and then the conductive pad 944 is formed to allow the passivation layer 960 to extend into a gap between the conductive pad 942 and the conductive pad 944. Similar to the formation of the conductive pad 944, the conductive pad 946 is also formed to allow the passivation layer 980 to extend into a gap between the conductive pad 944 and the conductive pad 946. In an embodiment, the conductive pad 942 is made of copper, and the conductive pads 944 and 946 are made of aluminum-copper alloy with 0.5% copper. In other embodiments, the conductive pad 942 and the conductive pads 944 and 946 can be made of the same or different conductive materials. In addition, the conductive pads 942, 944, and 946 have sizes and shapes to mechanically support the under bump assembly 950. For example, in some embodiments, the conductive pads 942, 944, and 946 are octagonal with widths at 80-85 μm.

The conductive structures 932 and 972, the metal-containing layers 920a and 920b, and the conductive pads 942, 944, and 946 are formed to electrically couple a portion of the circuitry on the substrate 910 with the bump structure 950. The metal-containing layers 920a and 920b and the top metal-containing layer 930 are only exemplary, and in some embodiments, there can be more or less than two metal-containing layers and one top metal-containing layer. Further, in some embodiments, the passivation layers 960 and 980 can be made of the same or different dielectric materials. For example, the passivation layers 960 and 980 may include silicon nitride and may also include small amounts of oxide and/or carbide.

Figure 10A:
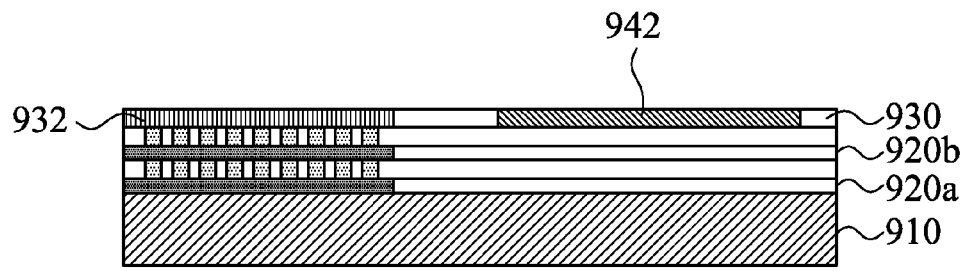
FIGS. 10A-10F are cross-sectional views showing a method of manufacturing the semiconductor device depicted in FIG. 9.
Figure 10B:
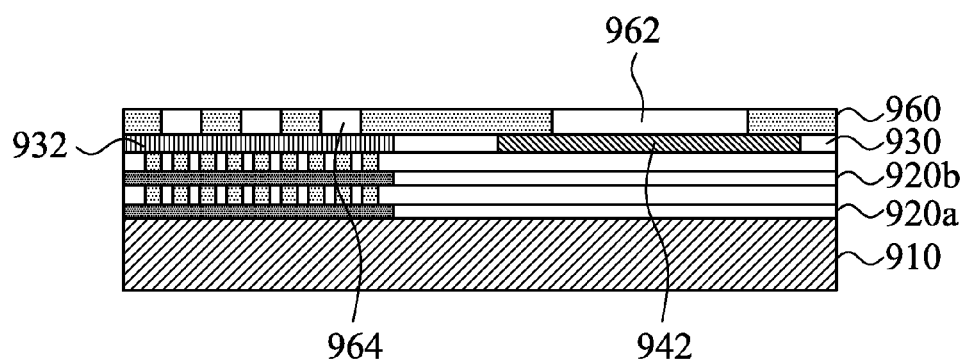

FIGS. 10A-10F are cross-sectional views showing a method of manufacturing the semiconductor device 900 depicted in FIG. 9. In FIG. 10A, a conductive pad 942 and a conductive structure 932 are formed concurrently at a top metal-containing layer 930 over a substrate 910 and two metal-containing layers 920a and 920b. In some embodiments, the conductive structure is an extended portion of the conductive pad 942 and works as a redistribution layer. The substrate 910 has circuitry formed thereon. Referring to FIG. 10B, a dielectric layer 960 is formed on the top metal-containing layer 930 and over the conductive pad 942 and the conductive structure 932. The dielectric layer 960 is used as a passivation layer for protecting the structures underneath. A portion of the dielectric layer 960 is then removed to create an opening 962 and three redistribution via holes 964 through the dielectric layer 960. In some embodiments, it is possible to have more or less than three redistribution via holes 964.

Figure 10C:
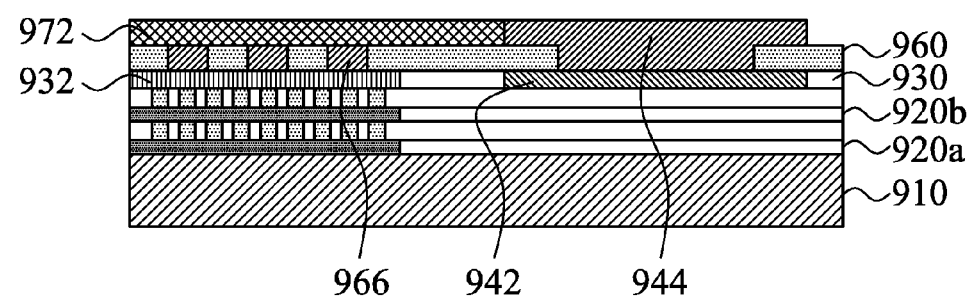
Figure 10D:
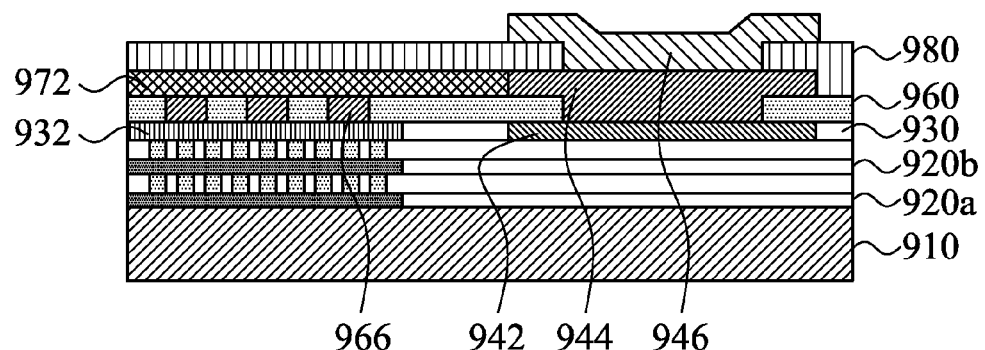
Figure 10E:
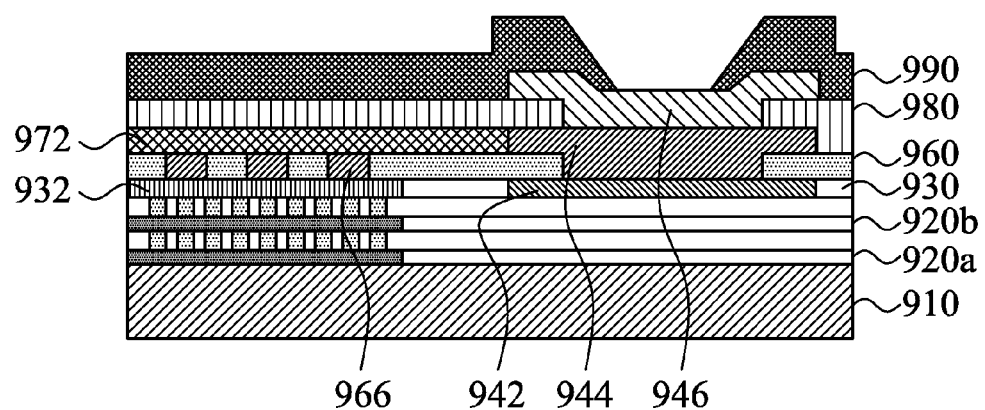
Figure 10F:
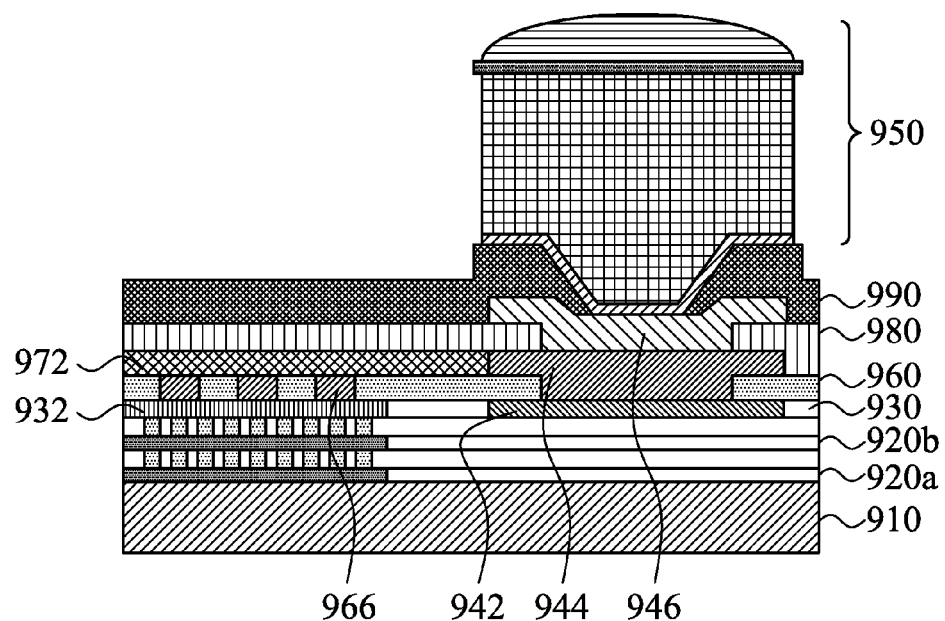

Referring to FIG. 10C, the redistribution via holes 964 are filled to form redistribution via hole plugs 966 and a conductive redistribution structure 972 is formed over the dielectric layer 960. The conductive redistribution structure 972 is connected to the conductive structure 932 through the redistribution via hole plugs 966. Also, the opening 962 is filled and a conductive pad 944 is formed over and connected to the conductive pad 942 through the opening 964. In an embodiment, the conductive redistribution structure 972 is an extended portion of the conductive pad 944. Referring to FIG. 10D, another dielectric layer 980 working as a passivation layer is formed over the dielectric layer 960, the conductive pad 944, and the conductive redistribution structure 972. Further, a third conductive pad 946 is formed over the dielectric layer 980. The conductive pad 946 is connected to the conductive pad 944 via an opening formed through the dielectric layer 980. In FIG. 10E, a protection layer 990 is further formed over the dielectric layer 980 and the conductive pad 946, and an opening is formed to expose a portion of the conductive pad 946. Finally, in FIG. 10F, an under bump assembly 950 is formed over the conductive pad 946.

Figure 11:
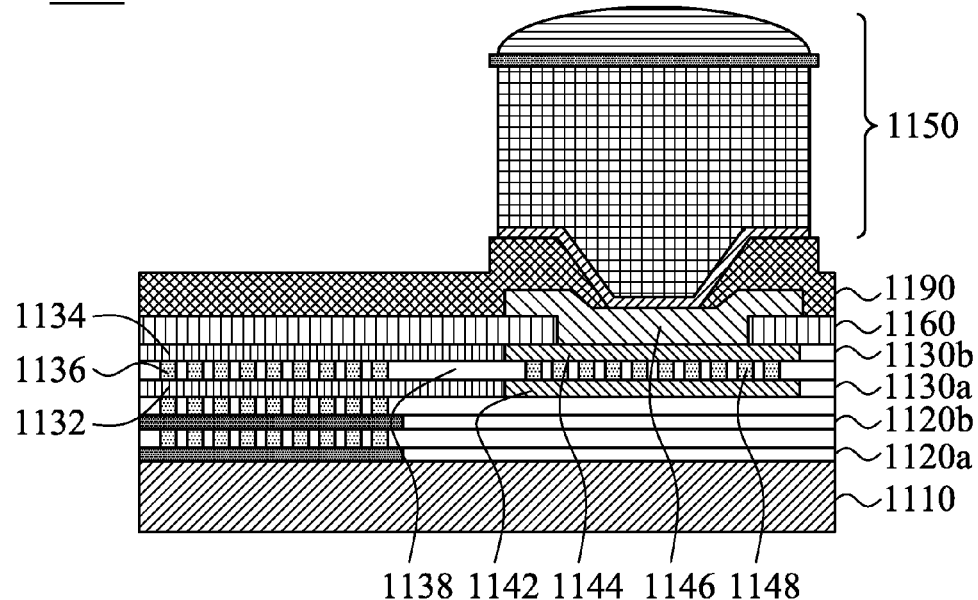
FIG. 11 is a cross-sectional view of a semiconductor device according to an embodiment.

FIG. 11 is a cross-sectional view of a semiconductor device 1100 according to an embodiment. Similar to the embodiment depicted in FIG. 7, the semiconductor device 1100 has a substrate 1110 with circuitry formed thereon. Two metal-containing layers 1120a and 1120b are formed over the substrate 1110, and two top metal-containing layers 1130a and 1130b are formed over the metal-containing layers 1120a and 1120b. Two conductive structures 1132 and 1134 are formed at the top metal-containing layer 1130a and top metal-containing layer 1130b, respectably. The conductive structures 1132 and 1134 are connected with each other by a set of top via plugs formed in a top dielectric layer 1138 by filling a set of top via holes 1136 with a conductive material. Three conductive pads 1142, 1144, and 1146 are formed over the metal-containing layers 1120a and 1120b and the semiconductor substrate 1110, and electrically connected to at least one of the conductive structures 1132 and 1134. A bump structure 1150 is formed over the conductive pads 1142, 1144, and 1146 and electrically coupled to the conductive pads 1142, 1144, and 1146.

Further, the top dielectric layer 1138 is formed over the conductive structure 1132 and the conductive pad 1142, and under the conductive structure 1134 the conductive pad 1144. A plurality of openings 1148 formed through the top dielectric layer 1138, and the conductive pad 1142 (the bottom pad) and the conductive pad 1144 (the middle pad) are connected through the openings 1148. In one embodiment, there is only one opening 1148; in other embodiments, the openings 1148 are formed as via holes. The conductive structure 1134 is formed over the top dielectric layer 1138 and under a passivation layer 1160, which is formed over the top metal-containing layers 1130a and 1130b and the conductive structures 1143 and 1134.

A passivation layer 1160 is formed over the top metal-containing layer 1130b and the conductive structure 1134. An opening 1162 (FIG. 12B) is formed through the passivation layer 1160. The conductive pad 1146 (the top pad) and the conductive pad 1144 are connected through the opening 1162. Finally, a protection layer 1190, such as a polyimide layer, is formed over the passivation layer 1160 and the conductive pad 1146. In some embodiments, the passivation layer 1160 extends into a gap between the conductive pad 1144 and the conductive pad 1146.

The conductive structure 1132 and the conductive pad 1142 are formed at the top metal-containing layer 1130a, and the conductive structure 1134 and the conductive pad 1144 are formed at the top metal-containing layer 1130b. The conductive structures 1132 and 1134 are connected to the conductive pads 1142 and 1144 at the top metal-containing layers 1130a and 1130b, respectively. In other embodiments, only one of the conductive structures 1132 and 1134 is connected to the corresponding conductive pads 1142 and 1144. In some embodiments, at least one of the conductive structures 1132 or 1134 is an extended portion of a respective conductive pad 1142 or 1144 and works as a redistribution layer. In a particular embodiment, conductive structure 1132 is an extended portion of conductive pad 1142 and works as a redistribution layer, and conductive structure 1134 is an extended portion of conductive pad 1144 and works as another redistribution layer.

Similar to the embodiment depicted in FIG. 7, in an embodiment, the conductive structures 1132 and 1134 are made of metal, such as copper or alloy including copper. In some embodiments, the conductive pad 1144 is formed by first filling the openings 1146 formed through the top dielectric layer 1138 to establish electric contact with the conductive pad 1142, and then the conductive pad 1144 is formed concurrently with the conductive structure 1134. In an embodiment, the conductive pads 1142 and 1144 are made of copper, and the conductive pad 1146 is made of aluminum-copper alloy with 0.5% copper. In some embodiments, the conductive pads 1142, 1144, and 1146 can be made of the same or different conductive materials. In addition, the conductive pads 1142, 1144, and 1146 have sizes and shapes to mechanically support the under bump assembly 1150.

The conductive structures 1132 and 1134, the metal-containing layers 1120a and 1120b, and the conductive pads 1142, 1144, and 1146 are formed to electrically couple a portion of the circuitry on the substrate 1110 with the bump structure 1150. The metal-containing layers 1120a and 1120b and the top metal-containing layers 1130a and 1130b are only exemplary, and in some embodiments, there can be more or less than two metal-containing layers and two top metal-containing layers. Further, in some embodiments, the passivation layers 1160 include silicon nitride and may also include small amounts of oxide and/or carbide.

Figure 12A:
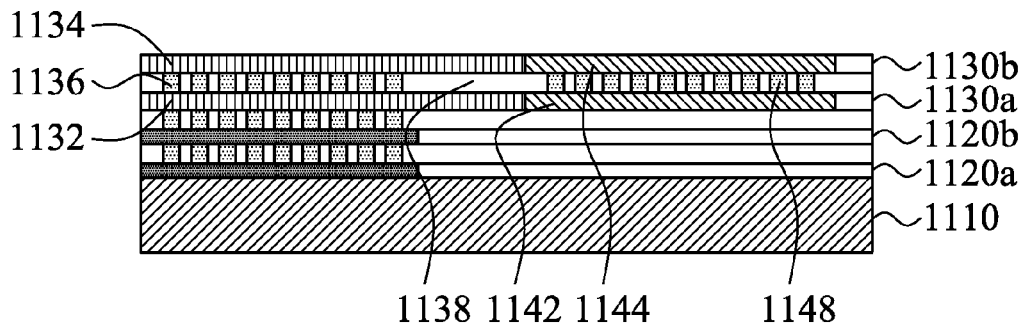
FIGS. 12A-12E are cross-sectional views showing a method of manufacturing the semiconductor device depicted in FIG. 11.

FIGS. 12A-12E are cross-sectional views showing a method of manufacturing the semiconductor device 1100 depicted in FIG. 11. In FIG. 12A, a conductive pad 1142 and a conductive structure 1132 extending from the conductive pad 1142 are formed at a top metal-containing layer 1130a over a substrate 1110 and two metal-containing layers 1120a and 1120b. The conductive pad 1142 and a conductive structure 1132 may be formed at the same time. The substrate 1110 has circuitry formed thereon. Then a dielectric layer 1138 is formed on the top metal-containing layer 1130a and over the conductive pad 1142 and the conductive structure 1132. The dielectric layer 1138 is used as a top dielectric layer to separate the top metal-containing layer 1130a from another top metal containing layer 1130b. A portion of the dielectric layer 1138 is removed to create a plurality of openings 1148 and top via holes 1136 through the dielectric layer 1138. The top via holes 1136 are filled with a conductive material and a conductive structure 1134 is formed over and connected to the conductive structure 1132 through the top via holes 1136, and the openings 1148 are filled with a conductive material and a conductive pad 1144 is formed over and connected to the conductive pad 1142 through the openings 1148. Further, in some embodiments, the conductive pad 1144 and the conductive structure 1134 extending from the conductive pad 1144 are formed concurrently at the top metal-containing layer 1130b over dielectric layer 1138.

Figure 12B:
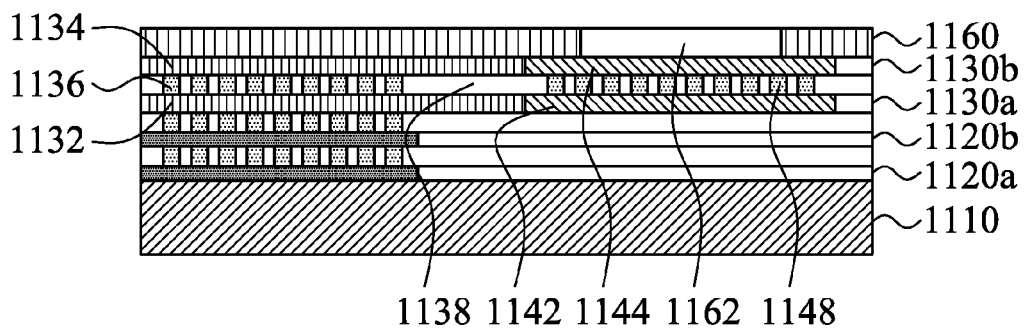
Figure 12C:
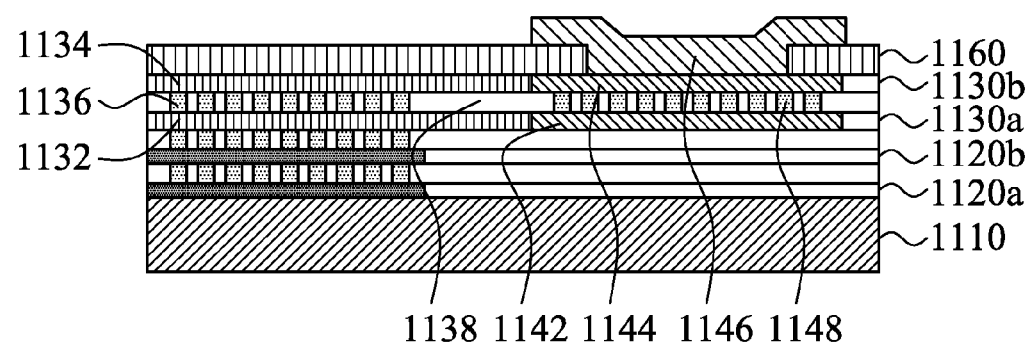
Figure 12D:
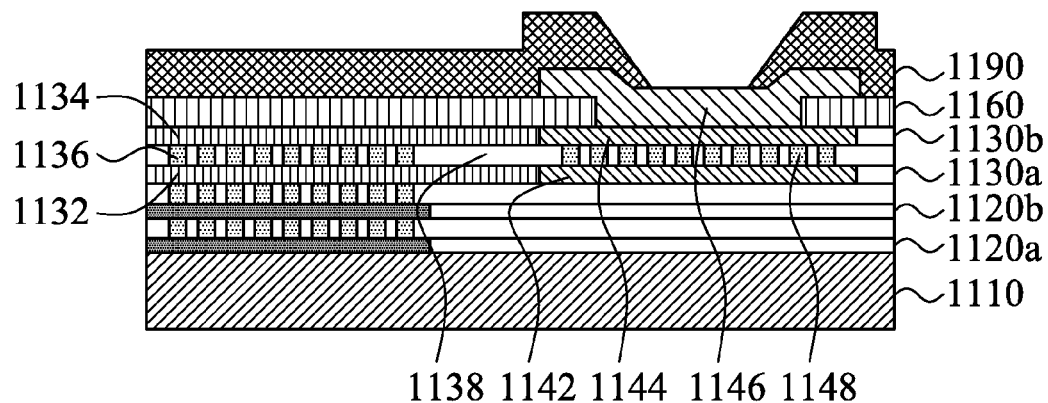
Figure 12E:
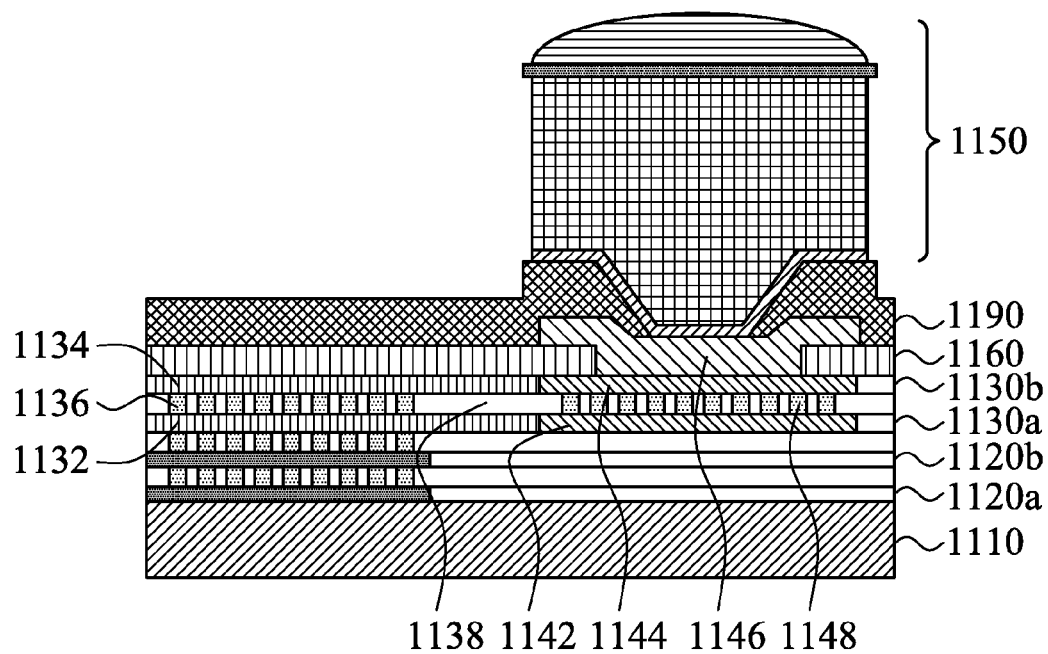

Referring to FIG. 12B, another dielectric layer 1160 is formed over the conductive pad 1144 and the conductive structure 1134. The dielectric layer 1160 is used as a passivation layer for protecting the structures underneath. Then a portion of the dielectric layer 1160 is removed to create another opening 1162. Referring to FIG. 12C, the opening 1162 is filled and a conductive pad 1146 is formed over and connected to the conductive pad 1144 through the opening 1164. In FIG. 12D, a protection layer 1190 is further formed over the dielectric layer 1160 and the conductive pad 1146, and an opening is formed to expose a portion of the conductive pad 1146. Finally, in FIG. 12E, an under bump assembly 1150 is formed over the conductive pad 1146.

Various embodiments for semiconductor devices having conductive pads are presented in the disclosure. A semiconductor device having two or more conductive pads has been found to protect the inter-metal dielectric layer (IMD) between the metal-containing layers from delamination and other defects caused by the stress and strain from the bump structure or during packaging process. The embodiments disclosed in the specification and the drawings are not exhaustive. While the present disclosure describes only up to three conductive pads, more conductive pads may be used to further enhance structural support for the bump structure and the packaging process. However, with increasing numbers of conductive pads, the wafer may become warped due to tensile stress. Therefore, an appropriate balance can be found between the benefits of additional conductive pads and disadvantages of the additional wafer processing, as well as increased internal stress due to warpage.

This description of the exemplary embodiments is intended to be read in connection with the figures of the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:
1. A semiconductor device comprising:
a substrate;
at least two conductive pads formed in consecutive conductive layers, and the at least two conductive pads aligned and one above another over the substrate, wherein a redistribution layer extends at least one of the conductive pads, and the redistribution layer and the at least one of the conductive pads comprise different conductive materials; and a bump structure formed directly on one of the conductive pads and electrically coupled to the conductive pads.

2. The semiconductor device of claim 1, further comprising a dielectric layer extending into a gap between a first conductive pad and a second conductive pad of the at least two conductive pads.

3. The semiconductor device of claim 1, wherein the bump structure comprises:
   a metal post formed over the conductive pads;
   a metal film formed over the metal post; and
   a cap formed over the metal film.

4. The semiconductor device of claim 3, wherein the metal post comprises copper, the metal film comprises nickel, and the cap comprises solder.

5. The semiconductor device of claim 1, wherein the at least two conductive pads comprise a first conductive pad and a second conductive pad, the second conductive pad being formed over the first conductive pad, and the second conductive pad having the redistribution layer.

6. The semiconductor device of claim 1, wherein the at least two conductive pads comprise a first conductive pad and a second conductive pad, the second conductive pad being formed over the first conductive pad, and the first conductive pad having the redistribution layer.

7. The semiconductor device of claim 6, wherein another redistribution layer extends the second conductive pad, wherein the another redistribution layer and the second conductive pad comprise different conductive materials.

8. A semiconductor device comprising:
   a substrate;
   first through third conductive pads formed in consecutive conductive layers, and the conductive pads aligned and one over another over the substrate, wherein a redistribution layer extends at least one of the conductive pads;
   a plurality of vias disposed between and electrically connecting the first and second conductive pads, the third conductive pad in direct physical and electrical contact with the second conductive pad; and
   a bump structure formed over the conductive pads and electrically coupled to the conductive pads.

9. The semiconductor device of claim 8, wherein the redistribution layer extends the second conductive pad and another redistribution layer extends the first conductive pad.

10. The semiconductor device of claim 9, wherein the redistribution layer and the second conductive pad comprise different conductive materials, and the another redistribution layer and the first conductive pad comprise different conductive materials.

11. The semiconductor device of claim 8, wherein the redistribution layer and the at least one of the conductive pads comprise different conductive materials.

12. The semiconductor device of claim 11, wherein the bump structure comprises:
   a metal post formed over the conductive pads;
   a metal film formed over the metal post; and
   a cap formed over the metal film.

13. The semiconductor device of claim 12, wherein the metal post comprises copper, the metal film comprises nickel, and the cap comprises solder.

14. A semiconductor device comprising:
   a substrate;
   a first conductive pad formed over the substrate and comprising an aluminum-copper alloy;
   a second conductive pad comprising copper and formed over the first conductive pad, wherein a redistribution layer extends the second conductive pad;
   a third conductive pad comprising copper and formed over the second conductive pad, the first conductive pad, the second conductive pad, and the third conductive pad being formed in consecutive conductive layers and aligned;
   a plurality of vias disposed between and electrically connecting the first and second conductive pads, the third conductive pad in direct physical and electrical contact with the second conductive pad; and
   a bump structure formed over the third conductive pad and electrically coupled to the third conductive pad.

15. The semiconductor device of claim 14, wherein the bump structure comprises:
   a metal post comprising copper and formed over the conductive pads;
   a metal film comprising Ni and formed over the metal post; and
   a cap comprising solder and formed over the metal film.

16. A method of manufacturing a semiconductor device, comprising:
   forming a first conductive pad over a substrate;
   forming a second conductive pad over the first conductive pad, the first conductive pad and the second conductive pad being formed in consecutive conductive layers and aligned;
   forming a redistribution layer as an extended portion of the first conductive pad or the second conductive pad when forming the first conductive pad or the second conductive pad, wherein the redistribution layer and the corresponding first or second conductive pad comprise different conductive materials; and
   forming a bump structure directly on one of the second conductive pad.

17. The method of manufacturing a semiconductor device of claim 16, wherein forming a bump structure comprising:
   forming a metal post over the second conductive pad;
   forming a metal film over the metal post; and
   forming a cap over the metal film.

18. The method of manufacturing a semiconductor device of claim 16, wherein the redistribution layer is formed when forming the first conductive pad, and the method further comprises forming another redistribution layer when forming the second conductive pad, wherein the another redistribution layer and the second conductive pad comprise different conductive materials.

19. The method of manufacturing a semiconductor device of claim 16, further comprising:
   forming a third conductive pad under the first conductive pad before forming the first conductive pad, the first conductive pad, the second conductive pad, and the third conductive pad being formed in consecutive conductive layers and aligned.

20. The method of manufacturing a semiconductor device of claim 19, wherein the redistribution layer is formed when forming the first conductive pad.

21. The semiconductor device of claim 1, wherein all conductive pads formed in consecutive conductive layers and electrically coupled to the bump structure are aligned.

* * * * *